(12) United States Patent
Limbrunner

(10) Patent No.: US 7,290,516 B2
(45) Date of Patent: Nov. 6, 2007

(54) ELECTRICAL CONNECTION DEVICE FOR INJECTION DEVICES OF INTERNAL COMBUSTION ENGINES

(75) Inventor: Hubert Limbrunner, Kirchroth (DE)

(73) Assignee: Siemens Aktiengesellschaft, Munich (DE)

( * ) Notice: Subject to any disclaimer, the term of this patent is extended or adjusted under 35 U.S.C. 154(b) by 156 days.

(21) Appl. No.: 11/093,504

(22) Filed: Mar. 30, 2005

(65) Prior Publication Data

US 2005/0217643 A1    Oct. 6, 2005

(30) Foreign Application Priority Data

Mar. 31, 2004   (DE) .................. 10 2004 015 837

(51) Int. Cl.
*H01T 13/00*    (2006.01)
*H01T 13/08*    (2006.01)

(52) U.S. Cl. ............... 123/143 C; 123/195 E; 439/130

(58) Field of Classification Search ............ 123/143 C, 123/195 E, 478, 490, 498, 499, 470; 439/130
See application file for complete search history.

(56) References Cited

U.S. PATENT DOCUMENTS

| | | | | |
|---|---|---|---|---|
| 5,127,382 A | * | 7/1992 | Imoehl | 123/470 |
| 5,203,292 A | * | 4/1993 | Motose | 123/143 C |
| 5,390,648 A | * | 2/1995 | Yanase | 123/634 |
| 5,584,704 A | * | 12/1996 | Romann et al. | 439/130 |
| 5,743,235 A | * | 4/1998 | Lueder | 123/468 |
| 5,771,850 A | * | 6/1998 | Okada | 123/143 C |
| 6,299,469 B1 | * | 10/2001 | Glovatsky et al. | 439/329 |
| 6,481,409 B1 | * | 11/2002 | Wade et al. | 123/198 F |
| 6,675,755 B2 | * | 1/2004 | Glovatsky et al. | 123/143 C |
| 6,748,926 B2 | * | 6/2004 | Lee et al. | 123/470 |
| 6,758,192 B2 | * | 7/2004 | Vanderveen et al. | 123/456 |
| 6,843,217 B2 | * | 1/2005 | Zwick et al. | 123/143 C |
| 6,886,538 B2 | * | 5/2005 | Lee et al. | 123/470 |
| 2002/0139344 A1 | * | 10/2002 | Kitada et al. | 123/195 C |
| 2003/0084859 A1 | * | 5/2003 | Glovatsky et al. | 123/41.31 |
| 2004/0074464 A1 | * | 4/2004 | Zwick et al. | 123/143 C |
| 2005/0253599 A1 | * | 11/2005 | Vanzullen et al. | 324/686 |

\* cited by examiner

*Primary Examiner*—Mahmoud Gimie
(74) *Attorney, Agent, or Firm*—Baker Botts L.L.P.

(57) ABSTRACT

In order to simplify an electrical connection device for injection devices, to make them more reliable and to simplify their installation, it is proposed that the electrical connection device has a printed circuit board (1) with printed circuit board tracks (3) arranged thereon, and the printed circuit board tracks (3) lead from a connector area to a respective coil, whereby the coils on the printed circuit board (1) are conductively arranged, and the printed circuit board, the connector area and the coils are injection-molded with plastic as a single piece and produce a structural unit.

18 Claims, 3 Drawing Sheets

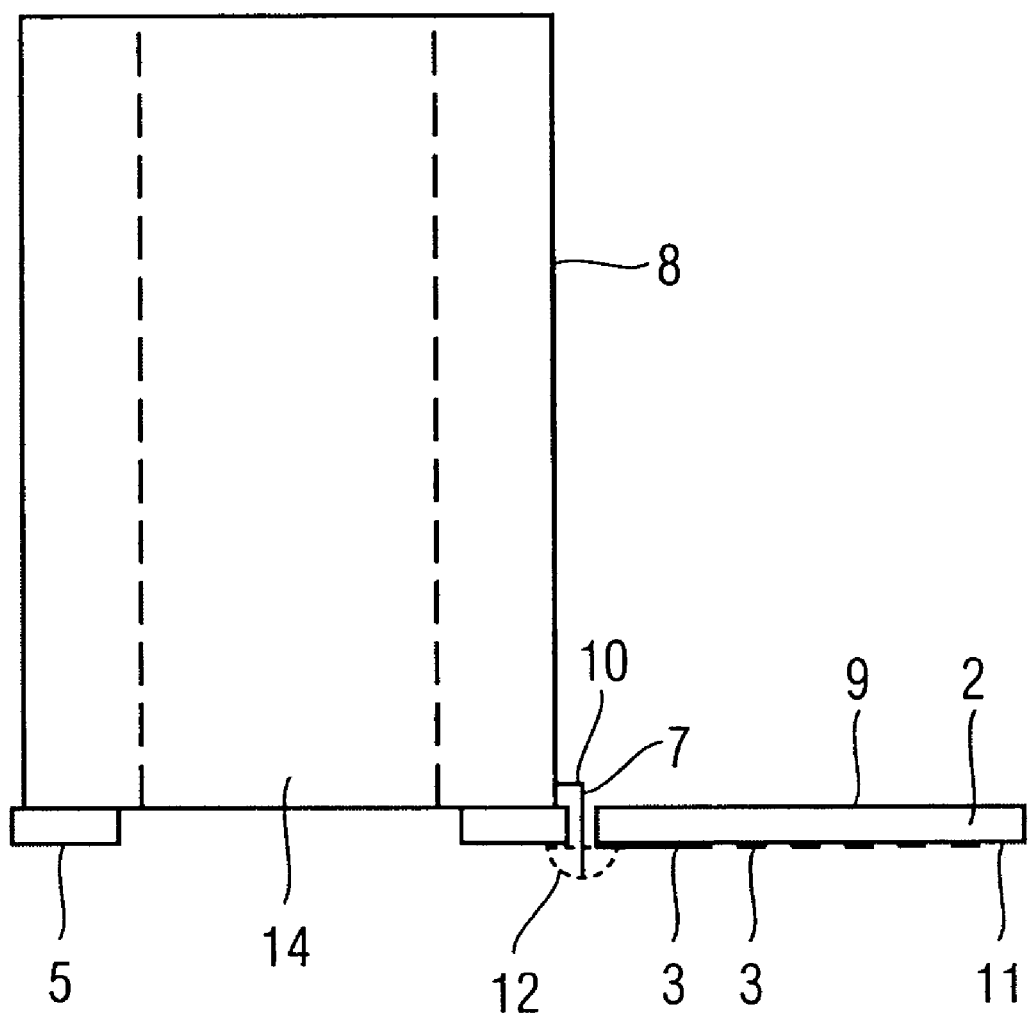

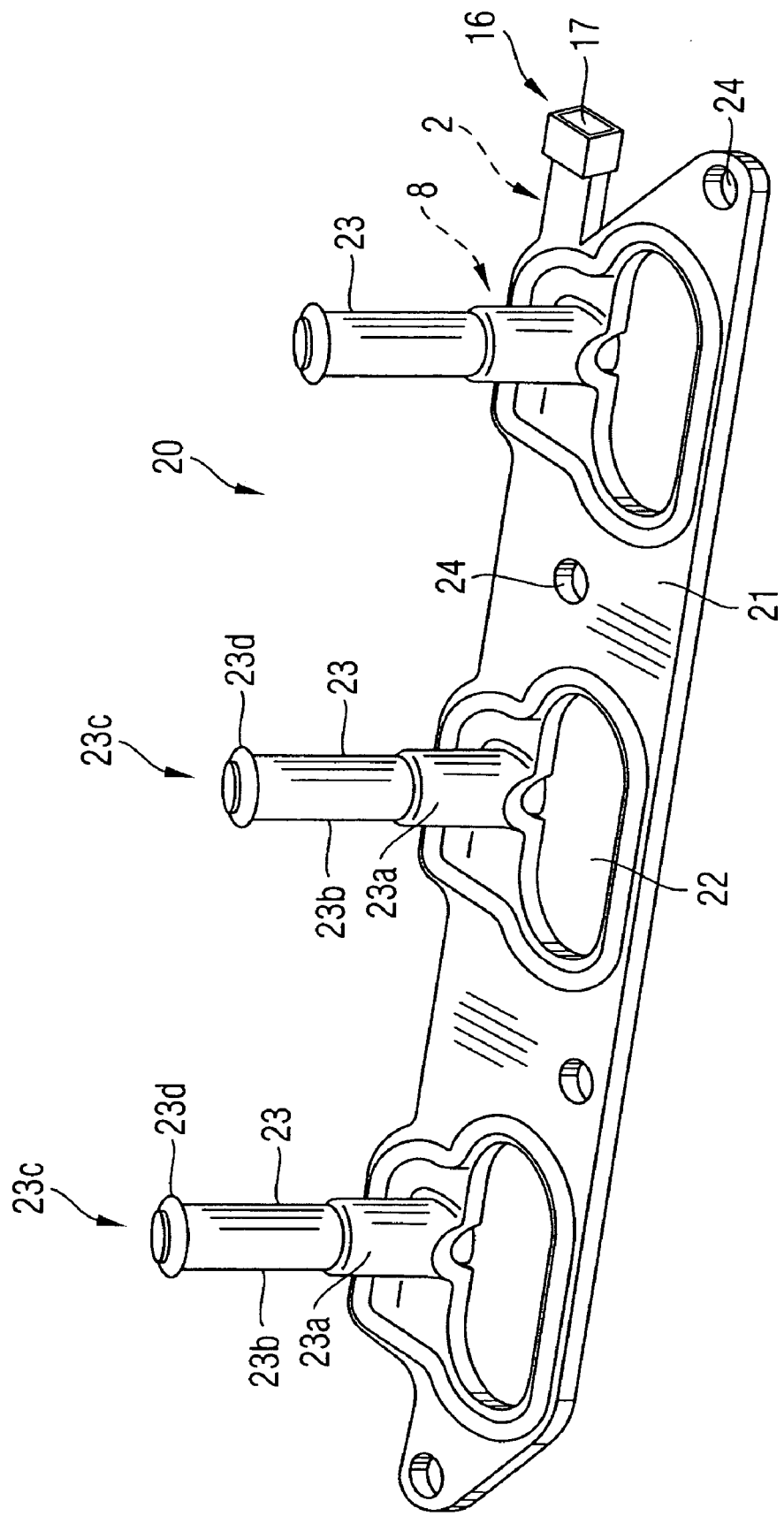

ELECTRICAL CONNECTION DEVICE FOR INJECTION DEVICES OF INTERNAL COMBUSTION ENGINES

PRIORITY

This application claims priority to German Application No. 10 2004 015 837.1 filed on Mar. 31, 2004.

1. Technical Field Of The Invention

The present invention relates to an improved electrical connection device for injection devices of internal combustion engines.

2. Description Of The Related Art

It is known that the injection devices of internal combustion engines can be operated electrically. Both so-called pump injector injection devices as well as injection nozzles of common-rail injection devices are supplied with electrical energy for this purpose. For pump injector injection devices, the fuel is pumped into the unit pump/nozzle by means of an electrical device and placed under pressure. For common-rail injection devices, the fuel is fed under pressure to the injection nozzles, and the injection nozzles are opened and closed with electrical devices. The injection devices must be supplied with electrical energy for this purpose. Typically, the electrical energy supply for the injection nozzles or the injection devices is thereby obtained by means of a cable harness with the corresponding lines leading to the cylinder banks and branching there to the individual injection devices, which are connected with individual connectors.

SUMMARY OF THE INVENTION

In this respect it is a disadvantage that the assembly of cable harnesses, the attachment of the connectors, and the harnessing of the cables and the installation of the cable harness to the internal combustion engine or the cylinder bank, is complex and expensive. The object of the invention is to simplify the electrical connection device for injection devices, to make them more reliable, and to simplify their installation.

The problem can be solved by an electrical connection device for injection devices of internal combustion engines, wherein the electrical connection device has a printed circuit board with at least one printed circuit board track, the printed circuit board track runs from a connector area to a respective coil, the coils are conductively arranged on the printed circuit board, and wherein the printed circuit board, the connector area and the coils are injection-molded with plastic as a single piece and produce a structural unit.

The printed circuit board can be an elongated printed circuit board with a printed circuit board base plate, the printed circuit board base plate can be formed in a flat-plate manner from a material customary for printed circuit boards, and the printed circuit board tracks can be applied underneath the printed circuit board plate. Receptacle areas can be present for coils on the printed circuit board base plate along a long side of the printed circuit board. Contact openings can be present in the printed circuit board base plate in an area of a base of the receptacles on the printed circuit board base plate in the form of solder eyes for the reception of connection pins of the coils, the solder eyes can be formed as drilled holes in the printed circuit board base plate, and a printed circuit board track can be led to the respective drilled holes. The coils can be arranged on an upper side of the printed circuit board base plate for equipping the printed circuit board with the coils, and connections in the form of connector pins of the coils engage the contact openings in the form of solder eyes and are soldered, welded or conductively connected with a Pressfit with the respective printed circuit board track leading to the hole by means of a soldering point on a lower side of the printed circuit board base plate. The coils may enclose a passage opening or a passage area in a hollow cylindrical manner, and the passage opening can be left open during the injection molding with plastic such that this can be freely engaged and forms an interior with a defined diameter for the reception of an injection device. The number of coils and thus the receptacle may correspond to the number of injection devices that are used on the engine block or on the cylinder bank, and the distance of the coils and the receptacles from one another approximately may correspond to the spacing of the cylinders on the motor or cylinder block. The printed circuit board tracks can be routed from the solder eyes to the narrow side of the printed circuit board for the connection of coils, and corresponding contact openings can be present there for each printed circuit board track, to which a connection device such as a connector housing is soldered, welded or conductively connected with a Pressfit connection and attached. The printed circuit board may produce a structural unit with the coils as well as the connection device, where applicable. The structural unit injection-molded with plastic may have a means of installation or installation openings in order to mount the unit on a cylinder head.

According to the invention, the entire electrical connection device of a number of injection devices, for example the injection devices of a cylinder bank or of an engine block, is designed as a structural unit. According to the invention, it is intended that a printed circuit board be used instead of the cable harness, whereby the corresponding coils of the injection devices are connected to the printed circuit boards, and subsequently both the printed circuit board as well as the coils are injection-molded with plastic. The final installation then takes place, in which the valve units of the injection devices are inserted into the corresponding openings for the coils such that they can be controlled by the coils.

An advantage of the invention is that the manufacture of the unit from printed circuit board, coils of the injection devices and plastic mount for the injection devices is considerably more advantageous than known solutions. Just as in the form of long and narrow printed circuit boards, no significant modifications are to be made to the form of an injection-molding device. In addition, a cost saving is achieved through the decrease of the number of components, and furthermore the injection devices together with their electrical connection device thereby create a component which can be attached uniformly to an engine block or a cylinder bank, which quite considerably simplifies the installation. In addition, an embodiment according to the invention of the electrical connection device of the injection devices is more reliable because, for example, a secure connection is ensured by soldering the coils, and only a single connection assembly is necessary for the connection of all coils, which is accommodated on the printed circuit board. Furthermore, the coils and the printed circuit board are injection-molded with plastic in order to be protected on the exterior against mechanical stress and also against the effects of atmospheric conditions.

BRIEF DESCRIPTION OF THE DRAWINGS

The invention is illustrated by way of example with a drawing. This shows:

FIG. 2: The printed circuit board according to FIG. 1 in cross-section with a soldered coil for the control of an injection device; and FIG. 3: A structural unit according to the invention in a pre-assembled state for a cylinder bank with three cylinders, whereby the printed circuit board and the coils with injection-molded plastic and injection devices are inserted into the coil openings.

DETAILED DESCRIPTION OF THE PREFERRED EMBODIMENTS

Figure 1:
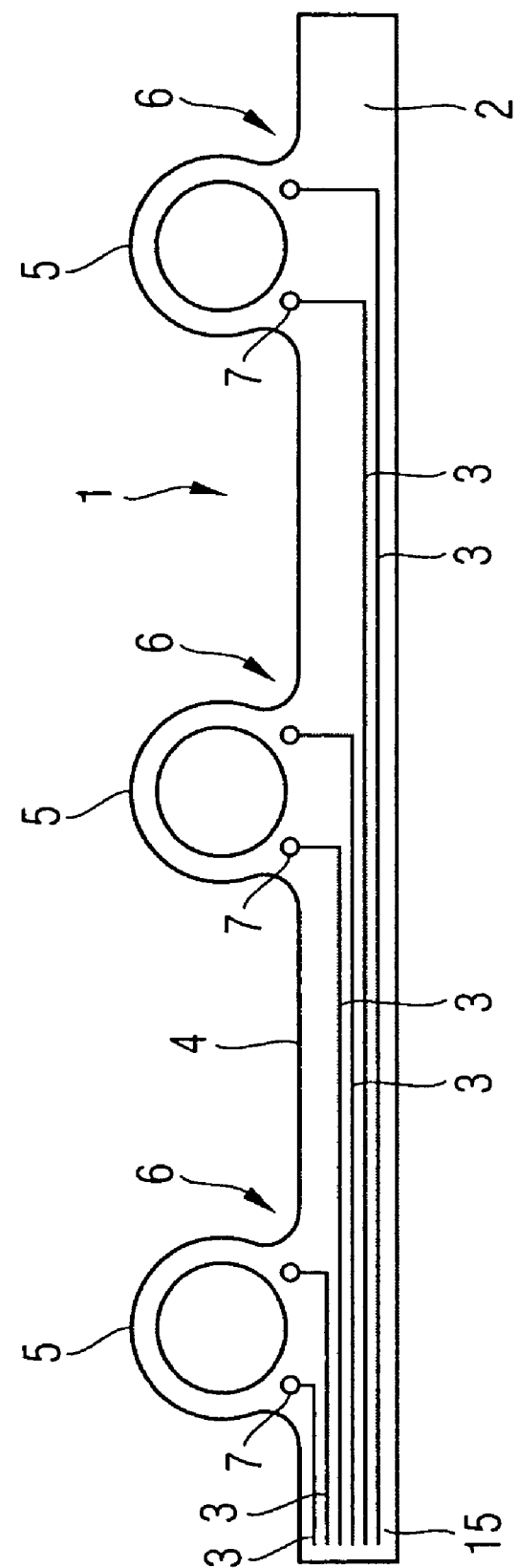
FIG. 1: A bottom view of the printed circuit board of the electrical connection device according to the invention and structural unit of an injection device.

A printed circuit board 1 for the electrical connection device and structural unit according to the invention is designed, according to FIG. 1 and FIG. 2, as an elongated printed circuit board 1 with a printed circuit board base plate 2. The printed circuit board base plate 2 is constructed evenly out of a material customary for printed circuit boards. Underneath, printed circuit board tracks 3 are introduced onto the printed circuit board plates in known ways. Along a long side 4 of the printed circuit board 2, receptacle mounts 5 are present on the printed circuit board base plate for coils (not shown in FIG. 1). In the simplest case, areas on the long side 4 of the printed circuit board are assigned to the receptacles 5, on which printed circuit board tracks 3 are routed for the connection of the coils, such that only two contact openings are present near the receptacle 5 in the simplest case.

In a further embodiment, the receptacles are, for example, in essence circular and single-piece printed circuit board parts, which can also take over a bearing function for the coils in this respect. Near the receptacles 5 or a base 6 of the circular receptacles 5, contact openings in the form of solder eyes 7 are present in the printed circuit board base plate 2.

The contact openings in the form of solder receptacle openings 7 are, for example, drilled holes in the printed circuit board plate 2, whereby a printed circuit board track 3 is routed to the drilled holes in each case. The connection can take place by soldering, welding or by so-called Pressfits. At the same time connections, for example connector pins 10, are pressed into the contact opening of the printed circuit boards 1. The drilled holes 7 are aligned to the respective connection method, whereby, in order to solder the connection pins, a coil is pushed through the solder eyes 7 and soldered from the opposite side. In principle, a weld takes places in the same way but has higher temperature resistance. With so-called Pressfits, connections are designed in the form of connector pins 10 in such a way that they have a certain elasticity and are anchored without further measures by means of a tight fit connecting in the openings. It should be noted that it is sufficient to connect with a printed circuit board track 3 only one solder eye of the two solder eyes 7 located near the receptacle 5. The other solder eye can then, for example, be grounded with the help of a wire (not illustrated).

The coils 8 are designed in such a way that the coil wire is wound around a plastic cylinder, whereby connections in the form of connector pins 10 are arranged in the known way at a base of the plastic cylinder. The coils 8 enclose a passageway 14 in a hollow cylindrical manner, which essentially corresponds to a circular receptacle 5.

The number of coils 8 and thus of circular receptacles 5 corresponds to the number of injection devices that should be used on the engine block or on the cylinder bank. In this respect, the spacing of the coils 8 or circular receptacle 5 from one another approximately corresponds to the spacing of the cylinders on the engine block. In order to connect the coils 8, the printed circuit board tracks 3 run from the drilled holes 7 to a narrow-sided end 15 of the printed circuit board 2 (FIG. 1), whereby corresponding contact openings in the form of solder eyes 7 are likewise present there for each printed circuit board track 3, such that a connection device 16, for example a connector housing 17 (FIG. 3), can be soldered, welded or attached with a Pressfit assembly there.

After the printed circuit board 1 is equipped with the coils 8, the printed circuit board 1 together with the coils 8 is injection-molded with plastic in order to obtain a structural unit 20 (FIG. 3). By means of the injection molding of the printed circuit board 1 and the coils 8, a compact structural unit 20 results, whereby this compact structural unit 20 has an essentially flat base plate 21. An injection-molded unit 20 is formed from the printed circuit board 1 and the coils 8 in such a way that the printed circuit board is coated with plastic on all sides, whereby a connector area arranged beforehand such as a connector housing is injection-molded with it. In this respect, the flat base plate 21 has a thickness of, for example, a few millimeters, whereby the dimensions and form of the base plate 21 is conformed to the flange pattern of an intake tube of the cylinder block or of the cylinder bank, such that the base plate (or also designated as a plate 21) is placed between the intake tube and the cylinder head in a form-fitting manner and is attached to the cylinder block with the intake tube. In the area of the inlet of the intake tubes or air supplies for the respective cylinders, cutouts 22 are present for the passage of the intake tubes or air distributor tubes, for example, oblong, oval cutouts 22.

In the area of the injection devices, hollow cylindrical pillars 23 are attached to the base plate 21, whereby these pillars hold the coils 8 in an area 23a adjacent to the plate 21. By injection-molding the unit 20 with plastic, the area 23a, around which the coil wire is wound, is excluded such that the hollow cylindrical interior of the plastic coil cylinder definitively limits a receptacle space for an injection valve to be inserted. The pillars 23 exhibit the area 23a and an injection device receptacle cylinder 23b. The unit 20 can further possess installation openings 24 in the area of the flat base plate 21 for attaching the flat base plate between the cylinder head and the intake tube.

Gasket devices 23d can be present at a top open end 23c of the pillars 23, by means of which a tight connection between the injection device and an attached fuel accumulator (common-rail) is produced. In the interior area of the pillar 23, an injection device (not shown) can be inserted and attached. In this respect, the injection devices or injectors are positioned such that they are correctly controlled by the coil. In addition, the injectors or injection devices can be aligned such that the spray pattern of the injection openings corresponds to the desired spray pattern. A structural unit 20 according to FIG. 3 includes an embodiment for the injection of fuel in the area of the intake tube in front of the inlet valves. However, it is also possible to supply the injection nozzles of a motor with power through direct injection with a printed circuit board injection-molded with plastic, whereby the position of the injection devices on the base plate 21 must here be adjusted according to the changed conditions.

The printed circuit board 1 can also be formed without the circular convexities 5 merely with drilled holes 7 along a long side 4, such that the coils are soldered, welded or are attached with Pressfit to the printed circuit board without a material support, and are later held by means of the plastic after the injection-molding.

I claim:

1. An electrical connection device for injection devices of internal combustion engines comprising:
   a printed circuit board supporting at least a respective hollow coil, said printed circuit board having at least one opening enclosed by said hollow coil in such a way that a passage opening is formed by said opening and said hollow coil; and
   at least one printed circuit board track running from a connector housing to the at least one respective coil, wherein the printed circuit board, the connector housing and the coils are injection-molded with plastic to form a single piece and a structural unit, wherein the printed circuit board is an elongated printed circuit board with a printed circuit board base plate, the printed circuit board base plate is formed in a flat-plate manner from a material customary for printed circuit boards, and wherein the printed circuit board tracks are applied underneath the printed circuit board plate.

2. The electrical connection device according to claim 1, wherein receptacle areas are present for coils on the printed circuit board base plate along a long side of the printed circuit board.

3. The electrical connection device according to claim 1, wherein contact openings are present in the printed circuit board base plate in an area of a base of the receptacles on the printed circuit board base plate in the form of solder eyes for the reception of connection pins of the coils, the solder eyes are formed as drilled holes in the printed circuit board base plate, and wherein a printed circuit board track is led to the respective drilled holes.

4. The electrical connection device according to claim 1, wherein the coils are arranged on an upper side of the printed circuit board base plate for equipping the printed circuit board with the coils, and wherein connections in the form of connector pins of the coils engage the contact openings in the form of solder eyes and are soldered, welded or conductively connected with a Pressfit with the respective printed circuit board track leading to the hole by means of a soldering point on a lower side of the printed circuit board base plate.

5. The electrical connection device according to claim 1, wherein the passage opening is left open during the injection molding with plastic such that this can be freely engaged and forms an interior with a defined diameter for the reception of an injection device.

6. The electrical connection device according to claim 1, wherein the number of coils and thus the receptacle corresponds to the number of injection devices that are used on the engine block or on the cylinder bank, and wherein the distance of the coils and the receptacles from one another approximately corresponds to the spacing of the cylinders on the motor or cylinder block.

7. The electrical connection device according to claim 1, wherein the printed circuit board tracks are routed from the solder eyes to the narrow side of the printed circuit board for the connection of coils, and wherein corresponding contact openings are present there for each printed circuit board track, to which a connection device such as a connector housing is soldered, welded or conductively connected with a Pressfit connection and attached.

8. The electrical connection device according to claim 1, wherein the printed circuit board produces a structural Unit with the coils as well as the connection device, where applicable.

9. The electrical connection device according to claim 1, wherein the structural unit injection-molded with plastic has a means of installation or installation openings in order to mount the unit on a cylinder head.

10. An electrical connection device for injection devices of internal combustion engines, the electrical connection device comprising:
    a printed circuit board comprising:
       an elongated printed circuit board base plate formed in a flat-plate manner from a material customary for printed circuit boards;
       a plurality of circular coil openings in the printed circuit board;
       a plurality of printed circuit board tracks applied underneath the printed circuit board plate; and
       a plurality of contact openings in the printed circuit board base plate respectively positioned in areas of the plurality of circular coil openings;
    a connector housing, wherein the plurality of printed circuit board tracks run from the connector housing to respective contact openings;
    a plurality of cylindrical coils arranged on the printed circuit board at respective circular coil openings and comprising coil connection pins engaged with respective contact openings; and
    wherein the printed circuit board, the connector housing, and the plurality of cylindrical coils form an injection-molded, plastic, single-piece structural unit.

11. The electrical connection device according to claim 10, wherein the plurality of circular coil openings are present for coils on the printed circuit board base plate along a long side of the printed circuit board.

12. The electrical connection device according to claim 10, wherein the plurality of cylindrical coils are arranged on an upper side of the printed circuit board base plate for equipping the printed circuit board with the coils, and wherein the coil connection pins are engaged with respective contact openings by solder, weld or conductively connected with a Pressfit with the respective printed circuit board track leading to the respective contact openings by means of a soldering point on a lower side of the printed circuit board base plate.

13. The electrical connection device according to claim 10, wherein the plurality of cylindrical coils enclose the circular openings in a hollow cylindrical manner, and wherein the circular openings are left open during the injection molding with plastic such that they can be freely engaged and form an interior with a defined diameter for the reception of respective injection devices.

14. The electrical connection device according to claim 10, wherein the number of cylindrical coils and circular coil openings correspond to the number of injection devices that are used on the engine block or on the cylinder bank, and wherein the distance of the cylindrical coils and the circular coil openings from one another approximately corresponds to the spacing of the cylinders on the motor or cylinder block.

15. The electrical connection device according to claim 10, wherein the printed circuit board tracks are routed from the solder eyes to the narrow side of the printed circuit board for the connection of coils, and wherein corresponding contact openings are present there for each printed circuit board track, to which the connector housing is soldered, welded or conductively connected with a Pressfit connection and attached.

16. The electrical connection device according to claim 10, wherein the printed circuit board produces a structural unit with the cylindrical coils as well as the connector housing, where applicable.

17. The electrical connection device according to claim 10, wherein the structural unit injection-molded with plastic has installation openings to mount the electrical connection device on a cylinder head.

18. The electrical connection device according to claim 10, wherein the plurality of contact openings comprise solder eyes that receive the coil connection pins, and the solder eyes are formed as drilled holes in the printed circuit board base plate, and wherein a printed circuit board track is led to the respective drilled holes.

* * * * *